United States Patent
Jeong

(10) Patent No.: US 7,561,426 B2
(45) Date of Patent: Jul. 14, 2009

(54) DISPLAY MODULE

(75) Inventor: Kwang-Jin Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 302 days.

(21) Appl. No.: 11/370,034

(22) Filed: Mar. 8, 2006

(65) Prior Publication Data

US 2006/0227507 A1  Oct. 12, 2006

(30) Foreign Application Priority Data

Apr. 12, 2005 (KR) .................. 10-2005-0030366

(51) Int. Cl.
H05K 7/20 (2006.01)
(52) U.S. Cl. .............. 361/704; 361/700; 361/679.47; 361/679.52; 313/46; 313/582
(58) Field of Classification Search .............. 313/46, 313/582; 361/700, 704; 165/80.3, 185, 104.33
See application file for complete search history.

(56) References Cited

U.S. PATENT DOCUMENTS

| 5,757,615 | A * | 5/1998 | Donahoe et al. ............. 361/687 |
| 6,950,303 | B2 * | 9/2005 | Neho et al. .................. 361/687 |
| 7,038,360 | B2 * | 5/2006 | Bae et al. ...................... 313/46 |
| 7,156,158 | B2 * | 1/2007 | Ueda et al. ............ 165/104.21 |
| 2001/0001981 | A1 | 5/2001 | Ueda et al. |
| 2004/0036413 | A1 * | 2/2004 | Bae et al. .................... 313/582 |
| 2005/0122019 | A1 * | 6/2005 | Bae ............................. 313/46 |
| 2006/0042786 | A1 * | 3/2006 | Chen ..................... 165/104.26 |
| 2006/0158851 | A1 * | 7/2006 | Bae et al. .................... 361/700 |
| 2006/0245214 | A1 * | 11/2006 | Kim ........................... 362/632 |
| 2006/0267499 | A1 * | 11/2006 | Yoo et al. .................. 313/582 |
| 2007/0068658 | A1 * | 3/2007 | Ueda et al. ............ 165/104.33 |

FOREIGN PATENT DOCUMENTS

| CN | 1402319 A | 3/2003 |
| JP | 62-238994 | 10/1987 |
| JP | 09-260973 | 10/1997 |
| JP | 10-301498 | 11/1998 |
| JP | 11-327449 | 11/1999 |

(Continued)

OTHER PUBLICATIONS

Korean Office Action for Korean Patent Application No. 2005-0030366, issued on Oct. 25, 2006.

(Continued)

*Primary Examiner*—Jayprakash N Gandhi
*Assistant Examiner*—Courtney Smith
(74) *Attorney, Agent, or Firm*—Robert E. Bushnell, Esq.

(57) ABSTRACT

Provided is a display module having an improved heatsink. The display module includes a display panel adapted to display an image, a chassis adapted to support the display panel, a driver circuit unit arranged on the chassis and adapted to generate an electrical signal that drives the display panel, an integrated circuit arranged on a signal transmitting unit, the integrated circuit being adapted to control signal transmission between the driver circuit unit and the display panel and at least one heatpipe arranged on a side of the chassis opposite the display panel, the heatpipe being adapted to transfer heat generated by the IC chip to the chassis.

21 Claims, 4 Drawing Sheets

FOREIGN PATENT DOCUMENTS

| | | |
|---|---|---|
| JP | 2002-172191 | 6/2000 |
| JP | 2001-013883 | 1/2001 |
| JP | 2001-083888 | 3/2001 |
| JP | 2002-151636 | 5/2002 |
| JP | 2005-093969 | 4/2005 |
| KR | 2004-040569 A * | 5/2004 |
| KR | 20040040569 A1 | 5/2004 |
| KR | 10-2005-0023013 | 3/2005 |
| KR | 2005-023013 A * | 3/2005 |

OTHER PUBLICATIONS

Office action from the Japanese Patent Office issued in Applicant's corresponding Japanese Patent Application No. 2006-092160 dated Dec. 9, 2008.

Chinese Office Action dated Feb. 6, 2009 corresponding to Chinese Patent Application No. 2006100574552.

* cited by examiner

DISPLAY MODULE

CLAIM OF PRIORITY

This application makes reference to, incorporates the same herein, and claims all benefits accruing under 35 U.S.C. § 119 from an application for PLASMA DISPLAY MODULE earlier filed in the Korean Intellectual Property Office on 12 Apr. 2005 and there duly assigned Serial No. 10-2005-0030366.

BACKGROUND OF THE INVENTION

1. Field of the Invention

The present invention relates to a display module, and more particularly, to a display module having an improved heatsink.

2. Description of the Related Art

The plasma display device is a widely used display device because of its small thickness and high-quality wide screen with a having viewing angle. A display module is a key component of a display device, and includes a display panel, a driving circuit unit for driving the display panel, and a chassis for supporting the driving circuit unit and the display panel. A display module used in the plasma display device includes a plasma display panel (PDP) for producing an image by gas discharge, a driving circuit unit for driving the PDP, and a chassis for supporting the PDP and the driving circuit unit.

The PDP includes a first panel and a second panel. The chassis of the PDP has a convex member for reinforcing the rigidity thereof. The driving circuit unit has signal transmitting units and a circuit for generating electrical signals to drive the PDP. The PDP includes a plurality of discharge cells located between a pair of facing substrates spaced apart from each other. An address electrode extends across the discharge cell to one or both ends of the substrate pair. The address electrode is used to select discharge cells for discharge by inducing an address discharge.

The driving circuit unit includes an address electrode driver generating an electrical signal for driving the address electrode, and a plurality of signal transmitting units having an integrated circuit (IC) chip mounted thereon to control signal transmission between the address electrode and the address electrode driver. The signal transmitting units can be tape carrier packages (TCPs). The signal transmitting units are arranged in a line on the chassis or on a convex unit for reinforcing the rigidity of the chassis, along a lower and/or upper edge of the chassis. The signal transmitting unit has one end connected to the PDP via the lower portion of the chassis and the other end connected to the address electrode driver.

In the plasma display device, the IC chip mounted on the signal transmitting unit generates a large amount of heat during the operation of the plasma display module. To increase the heatsink area of the IC chip, a thermally conductive heatsink sheet is disposed on the IC chip, and a cover plate is pressed and attached onto the heatsink sheet. In another heatsinking arrangement, a washer-type mold is disposed around the IC chip. However, such heatsinking arrangements do not make it possible to effectively dissipate the heat generated by the IC chip. In order to improve the heatsinking performance, a heatsink plate can be additionally mounted on the cover plate or a heatsink fan can be installed at a given position as to improve the heatsink effect of the IC chip. These arrangements, however, greatly increase the manufacturing costs of the display module. Moreover, since a region where the signal transmitting units (such as the TCP) are disposed is very small, it is difficult to install a plurality of heatsink plates or fans. Therefore, it is difficult to significantly improve the heatsink effect of the IC chip. Therefore, what is needed is a more effective and a more practical heatsink unit for display modules.

SUMMARY OF THE INVENTION

It is therefore an object of the present invention to provide an improved heatsink for display modules.

It is also an object of the present invention to provide for a practical heatsink for display modules that is easy to manufacture.

It is further an object of the present invention to provide a display module that uses a heatpipe capable of rapidly transferring heat generated at an IC chip to a chassis for dissipation of the heat to ambient air and thus has an improved heatsink effect.

It is yet an object of the present invention to provide a display module that uses a simple and inexpensive heatpipe capable improved heat dissipation and capable of keeping circuit drivers at a lower operation temperature without the need for a heatsink plate and/or a heatsink fan.

These and other objects can be achieved by a display module including a display panel adapted to display an image, a chassis adapted to support the display panel, a driver circuit unit arranged on the chassis and adapted to generate an electrical signal that drives the display panel, an integrated circuit arranged on a signal transmitting unit, the integrated circuit being adapted to control signal transmission between the driver circuit unit and the display panel and at least one heatpipe arranged on a side of the chassis opposite the display panel, the heatpipe being adapted to transfer heat generated by the IC chip to the chassis.

The heatpipe can be filled with a coolant. The coolant can be alcohol. The coolant can instead be Freon gas or Puron gas. The heatpipe can include a heating portion and a condensing portion. The heatpipe can include at least one heatsink pin arranged at the condensing portion of the heatpipe. The heatpipe can be of a U-shape, the heatpipe can also have a flat bottom. Both ends of a straight-line-shaped heating portion of the heatpipe can be respectively connected to bottoms of straight-line-shaped condensing portions, the heating portion can be essentially perpendicular to the condensing portions. At least a part of the heatpipe can be of a serpentine shape. At least a part of the condensing portion can be of a serpentine shape.

The display module can further include a convex unit arranged on the chassis, the convex unit can be adapted to support the signal transmitting unit. One surface of the heating portion of the heatpipe can be arranged to either directly contact the convex unit or contact the convex unit through a separate member arranged therebetween. An inner thickness of the heating portion of the heatpipe can be substantially identical to an inner width of the convex unit. An area of a surface of the heating portion contacting the convex unit can be substantially identical to an area of the surface of the convex unit facing the heating portion. One surface of the condensing portion of the heat pipe can either directly contact a surface of the chassis facing the condensing portion or contact the surface of the chassis through a separate member arranged therebetween.

The heatpipe can include an end-cap adapted to seal the heatpipe. The end-cap can be arranged at both ends of the heatpipe. The end-cap can include an epoxy and can be produced by an epoxy molding process. The heatpipe can have a quadrangular duct-shaped cross-section. The heatpipe can have an arch-shaped cross-section. The signal transmitting unit can be a tape carrier package (TCP). The display panel can be a plasma display panel that is adapted to produce an image by gas discharge.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
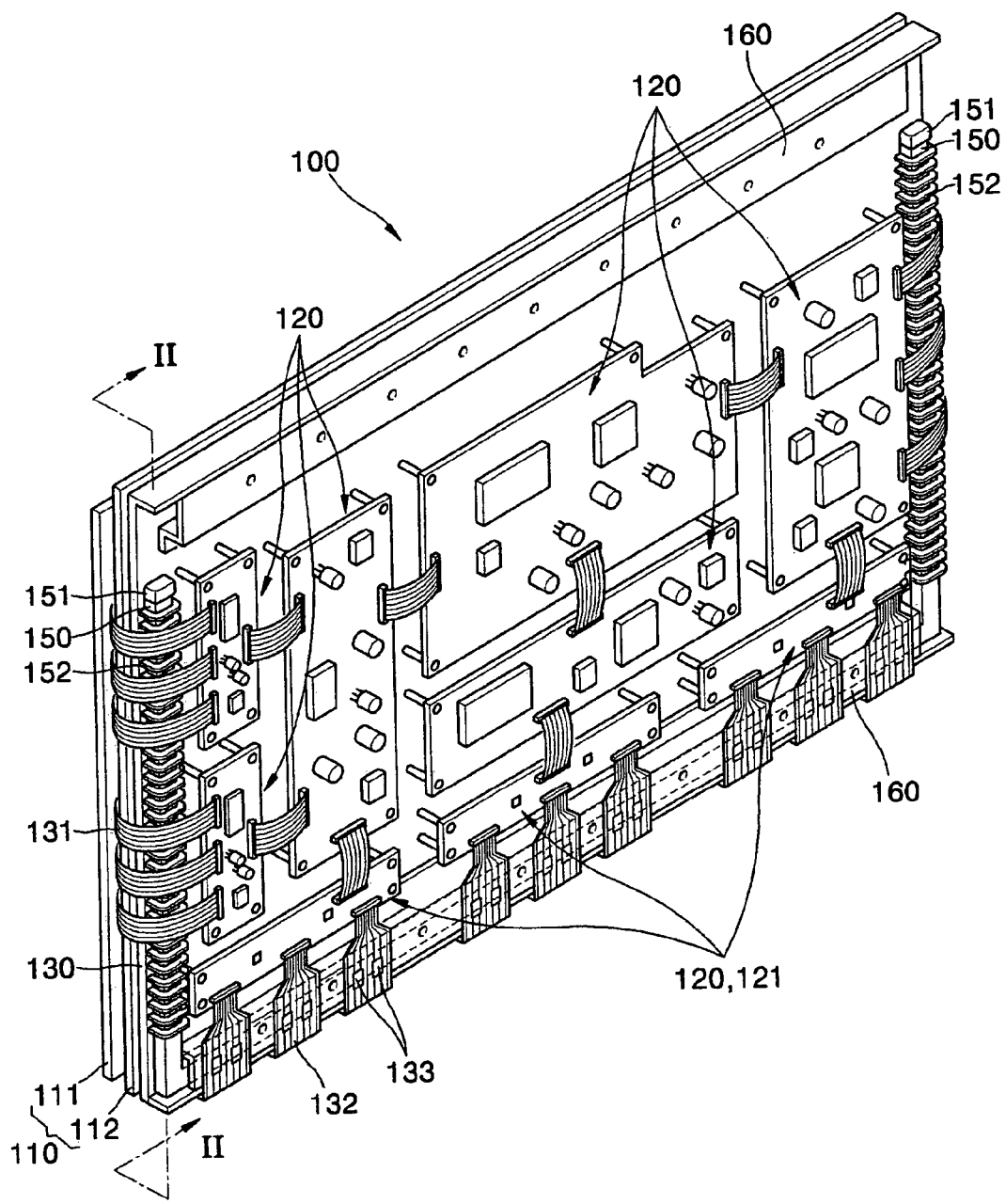
FIG. 1 is a perspective view of a display module according to a first embodiment of the present invention.
Figure 2:
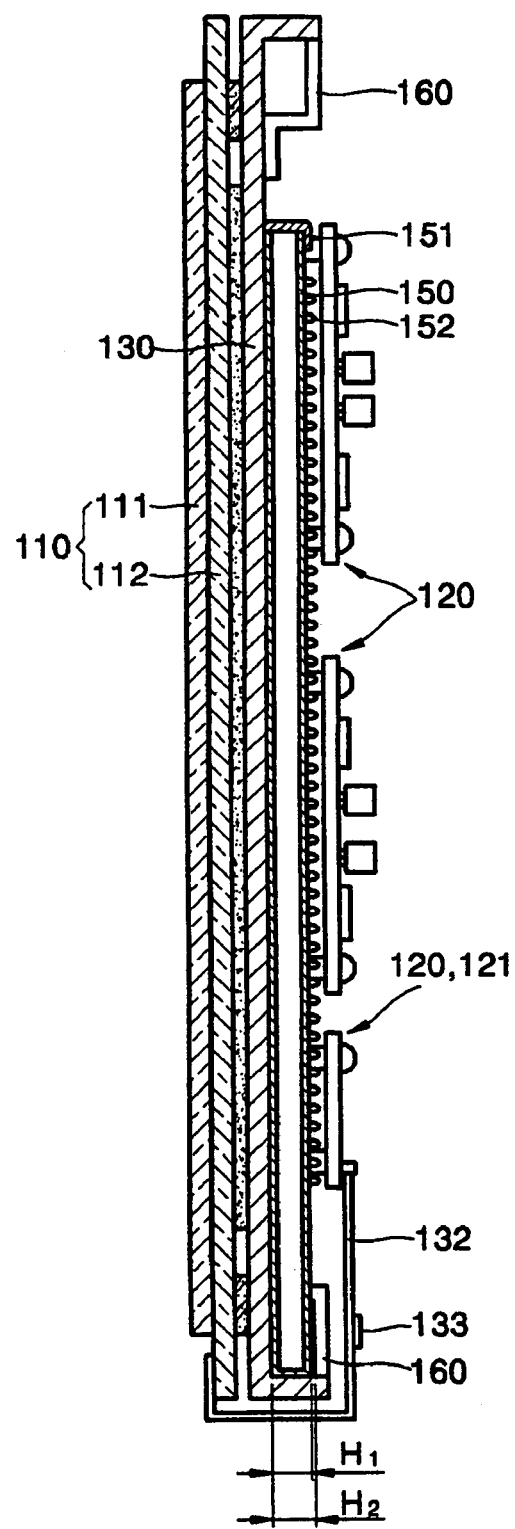
FIG. 2 is a sectional view taken along line II-II in FIG. 1.
Figure 3:
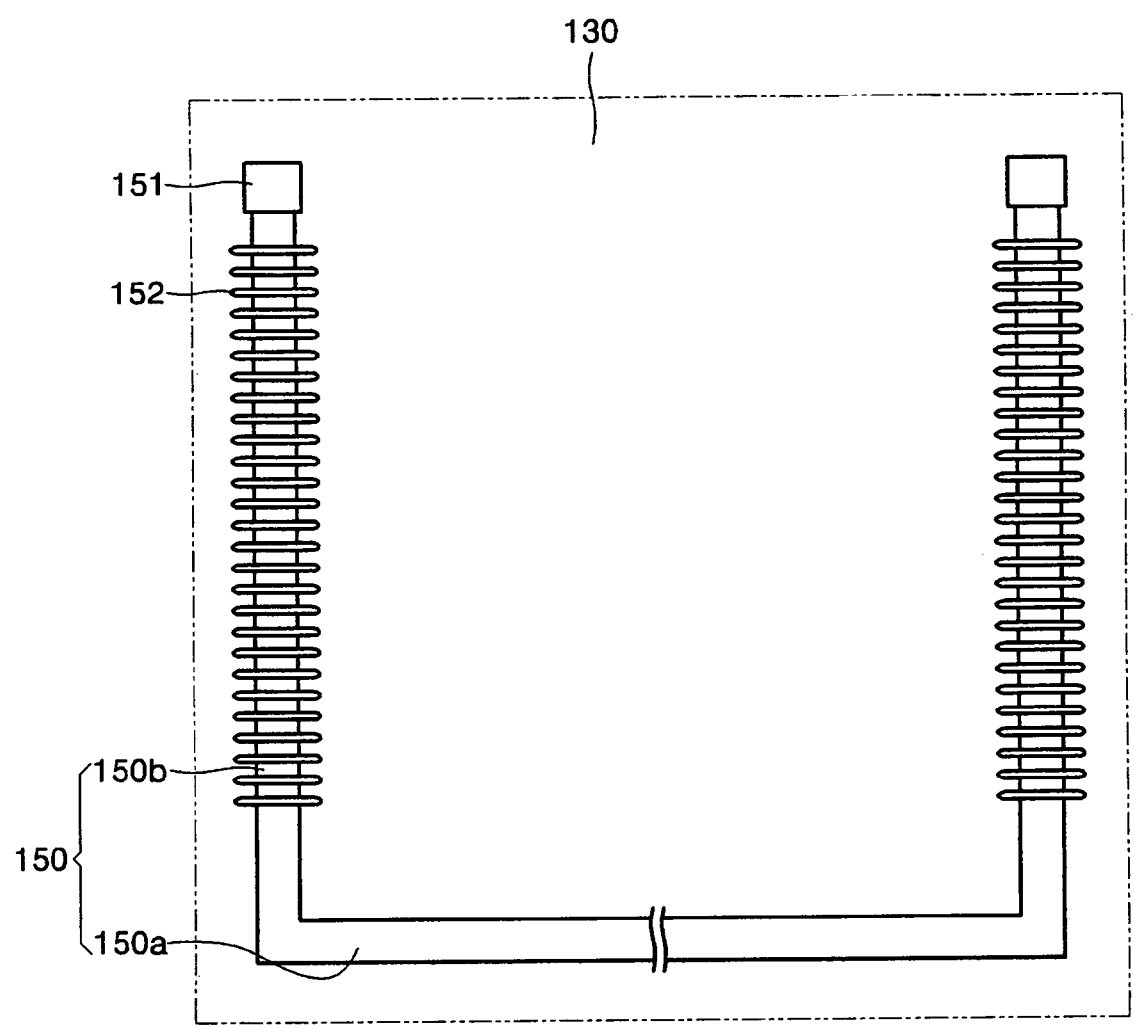
FIG. 3 is a plan view of the chassis of FIG. 1 where the heatsink is arranged thereon.

Turning now to the figures, FIG. 1 is a perspective view of a display module 100 according to an embodiment of the present invention, FIG. 2 is a sectional view taken along line II-II in FIG. 1 and FIG. 3 is a plan view of the chassis 130 of FIG. 1 with heatpipe 150 arranged thereon. Referring to FIGS. 1 through 3, the display module 100 includes a PDP 110 for producing an image. The PDP 110 can be any one of various types of PDPs. For example, the PDP 110 can be a 3-electrode AC surface-discharge PDP.

The PDP 110 includes a first panel 111 and a second panel 112 facing each other. Although not illustrated in FIG. 1, the first panel 111 includes a plurality of sustain electrode pairs disposed on a first substrate, a first dielectric layer covering the sustain electrode pairs, and a protective layer coated on the first dielectric layer. The sustain electrode pairs include stripe-shaped common electrodes and scan electrodes. Although not shown, the second panel 112 includes a plurality of address electrodes disposed on a second substrate to cross the sustain electrode pairs, a second dielectric layer covering the address electrodes, barrier ribs formed on the second dielectric layer to define discharge cells and to prevent cross-talk, and red (R), green (G) and blue (B) phosphor layers coated inside discharge cells defined by the barrier ribs. The discharge cells are filled with discharge gas, and correspond to regions where the sustain electrodes and the address electrodes cross each other.

A chassis 130 is disposed on one side of the PDP 110. The chassis 130 supports the PDP 110 and dissipates heat received from the PDP 110, thus preventing the PDP 110 from having a temperature higher than a predetermined value. The chassis 130 also prevents the thermal deformation or damage of the PDP 110 due to external impact. The chassis 130 must have a sufficient rigidity so as to prevent deformation or damage of the PDP 110. The display module 100 can include a convex member 160 disposed on the side of the chassis 130 opposite to the PDP 110 to reinforce the rigidity of the chassis 130.

A driver circuit unit 120, including an address electrode driver 121 generating an electrical signal for driving an address electrode (not illustrated), is installed on the side of the chassis 130 opposite to the PDP 110. The driver circuit unit 130 serves to drive the PDP 110. The driver circuit unit 120 is mounted with various electronic components (not illustrated) to supply power and voltage signals to the PDP 110 in order to produce a visible image.

The driver circuit unit 120 is electrically connected to the PDP 110 by signal transmitting units 131 and 132. Signal transmitting units 131 and 132 serve to transmit the signal produced by the driver circuit unit 120 to the PDP 110. The signal transmitting units 131 and 132 can be implemented using a flexible printed cable (FPC), a tape carrier package (TCP), and/or a chip on film (COF). The signal transmitting unit 132 is mounted with an IC chip 133 thereon that controls signal transmission between the address electrode and the address electrode driver 121.

In this first embodiment, at least one heatpipe 150 is disposed on one surface of the chassis 130 as illustrated in FIGS. 1 through 3. Specifically, the heatpipe 150 is disposed on the side of the chassis 130 opposite to the PDP 110 and serves to transfer heat generated by the IC chip 133 to the chassis 130. The heatpipe 150 can be attached to the chassis 130 by aluminum fusion welding. The heatpipe 150 is a sealed vacuum-evacuated tube filled with a working fluid. When one end of the heatpipe 150 is heated, the working fluid is vaporized and moves towards the other end by a pressure difference. This vapor releases heat to ambient air and then condenses and returns to a heating portion 150a of the heatpipe. When necessary, a material inducing a capillary force, such as a capillary structure, can also be inserted into the heatpipe 150.

The heatpipe using gravity and convection is called a thermosyphon, and does not need the capillary structure. In a thermosyphon, a condensed working fluid of a condenser returns to a heating portion by gravity. Therefore, the heating portion must be located under the condenser. Except for this restriction, the thermosyphon is similar to a general heatpipe with respect to the operational principle and application fields.

The heatpipe has the following advantages. First, the heatpipe can transfer a large amount of heat in an axial direction more rapidly than metal because it uses latent heat for heat transfer. Second, a heat flow rate in the thermosyphon can be controlled simply by control of an inclined angle because its heat resistance changes with a change in the inclined angle. Thirdly, the heatpipe is lightweight and simple in structure. Lastly, the heatpipe requires little maintenance.

The heatpipe 150 can be charged with coolant. The coolant is a heat transferring medium that changes phases between liquid and gas within the heatpipe 150 for heat dissipation. Generally, any kind of liquid can be used as the coolant. For stability and economy, alcohol, Freon gas, ammonia, or water is widely used as the coolant.

The heatpipe 150 can include the heating portion 150a and a condensing portion 150b. Heat generated by the IC chip 133 is transferred to the heating portion 150a to vaporize the coolant. The vaporized coolant is rapidly moved to the condensing portion 150b by convection. The moved coolant releases heat to ambient air and then condenses and returns to the heating portion 150a by gravity. According to the above operational principle, the heat generated by the IC chip 133 can be effectively dissipated to the outside.

At least one heatsink pin 152 can be disposed at the condensing portion 150b. By including the heatsink pins 152, the area of the condensing portion 150b contacting with ambient air is maximized to double the condensing speed of the vaporized coolant, resulting in an improved heatsink effect. The heatsink pin 152 can be any type, preferably, a disk type illustrated in FIG. 1. In no way is the present invention limited to the use of heatsink pins as no heatsink pin 152 can be used and still be within the scope of the present invention.

The heatpipe 150 can have a U-shape whose bottom portion is flat. The heating portion 150a can have a straight line type. Preferably, both ends of the heating portion 150a are respectively connected to bottoms of the straight line type condensing portions 150b such that the heating portion 150a is perpendicular to or inclined to the condensing portions 150b. The heating portion 150a can be horizontally disposed under the IC chips 133. When arranged this way, the heatpipe 150 can be operated using gravity. Accordingly, the capillary structure becomes unnecessary and the cost for the installation of the heatpipe 150 can be reduced. The present invention is not limited to the above structure as the heatpipe 150 can have other various shapes and structures.

A convex unit 160 supporting the signal transmitting unit 132 can be disposed on the chassis 130. The convex unit 160 can be formed as a single integrated body with the chassis 130. Alternatively, a separate convex unit 160 can be screw-connected to the chassis 130.

One surface of the heating portion 150a can directly contact with a surface of the convex unit 160 that faces the heating portion 150a to allow for heat transfer therebetween. Alternatively, the heating portion 150a can indirectly contact the surface of the convex unit 160 via a separate member (not illustrated) interposed therebetween to allow for heat transfer therebetween. In this second scenario, the separate member can be a thermally conductive medium (not illustrated), such as thermally conductive grease and a thermally conductive sheet.

In FIG. 2, the outer thickness $H_1$ (see FIG. 2) of the heating portion 150a can be substantially identical to the inner width $H_2$ (see FIG. 2) of the convex unit 160. Accordingly, when the heatpipe 150 is simply disposed on the chassis 130, the heating portion 150a can contact the convex portion 160 without having to use a separate member. Alternatively, the outer height $H_1$ of the heating portion 150a can be smaller than the inner height $H_2$ of the convex unit 160. In this second case, a separate member (not illustrated) with high heat conductivity, such as a heatsink sheet, must be used so that the heights $H_1$ and $H_2$ become similar to each other for contact of the unit 160 with the portion 150a.

The area of the heating portion 150a contacting with the convex unit 160 can be substantially identical to the area of the surface of the convex unit 160 facing the heating portion 150a. That is, the heating portion 150a can be formed in such a way that the contact area between the heating portion 150a and the convex portion 160 is maximized. When maximized, the heat transferred from the IC chip 133 to the convex unit 160 can be rapidly transferred to the heating portion 150a of the heatpipe 150. It is to be understood that the present invention is not limited to the above structure, but other designs are also possible, such as by varying the contact area between the heating portion 150a and the convex unit 160.

One surface of the condensing portion 150b can directly contact with one surface of the chassis 130 for heat transfer therebetween. Alternatively, one surface of the condensing portion 150b can indirectly contact one surface of the chassis 130 by having a separate medium interposed therebetween for heat transfer therebetween. Here, the separate member can be a thermally conductive medium (not illustrated), such as a thermally conductive grease and a thermally conductive sheet. When no separate member is needed, the heat generated by the IC chip 133 sequentially passes through the convex unit 160, the heating portion 150a, the coolant (not illustrated), and the condensing portion 150b and is transferred to the chassis 130 contacting the condensing portion 150b, or is transferred to ambient air surrounding the components, thus dissipating the generated heat to the outside.

The heatpipe 150 can also have an end-cap 151 to seal the heatpipe 150. The end-cap 151 can prevent the coolant filled within the heatpipe 150 from leaking out. The end-cap 151 attached to the heatpipe 150 can be disposed to cover an end of the condensing portion 150b opposite to an end of the condensing portion 150b connected the heating portion 150a. When the end-cap 151 is disposed near the heating portion 150a, the contact portion between the end-cap 151 and the heatpipe 150 can degrade or unfasten due to the high temperature and high pressure, resulting in a high possibility that the coolant, in either a gas state or a liquid state, will leak out. If the coolant leaks to the outside, a heatsink effect reduces significantly and the maintenance costs (resealing of the end-cap 151 and recharging of a coolant), significantly increases.

Further, when a leak occurs, if necessary steps are not taken timely, the IC chip 133 can then degrade and the entire lifespan of the display module 100 can be shortened.

The end-cap 151 can be formed by epoxy molding. The end-cap 151 can be formed of various materials as long as the same effect is obtained.

As illustrated in FIG. 1, the heatpipe 150 can have a cross-section of a quadrangular duct shape. By doing so, a heat transfer area can be maximized when the heatpipe 150 receives heat from the IC chip 133 or when the heatpipe 150 transfers the received heat to the chassis 130. However, the prevent invention is not limited to the above cross-section, as the heatpipe 150 can have other cross-sections, such as arch shape, a semicircular shape, as long as the same effect is achieved.

Here, the signal transmitting unit 132 can be a tape carrier package (TCP), but the present invention is not limited to this. The heatpipe 150 can be applied to various signal transmitting units regardless of the construction or characterization of the signal transmitting unit 132.

An operation of the display module 100 with the heatpipe 150 will now be described in detail. When the display module 100 is operated, the driver circuit unit 120 operates to apply a voltage to the PDP 110. This applied voltage to the PDP 110 causes an address discharge and a sustain discharge to occur. During the sustain discharge, the energy level of excited discharge gas is lowered causing ultraviolet rays to be emitted. The emitted ultraviolet rays excite the phosphor within a phosphor layer (not illustrated) coated on the inside of a discharge cell (not illustrated). Thereafter, the energy level of the excited phosphors are lowered, resulting in the emission of visible light. The emitted visible light is projected through a first substrate (not illustrated) of the PDP 110, thus forming an image that can be recognized by a viewer.

When these images are produced, heat is generated by the IC chip 133 disposed on the signal transmitting unit 132 is transferred to the convex member 160 whose temperature is lower than the temperature of the IC chip 133. Some of the heat transferred to the convex member 160 is directly transferred to ambient air by convection and the rest of the heat is rapidly transferred directly to the heatpipe 150 by heat transfer or to the heatpipe 150 via a thermally conductive medium (not illustrated), such as a thermally conductive grease and a thermally conductive sheet. In detail, the heat is rapidly transferred to the heating portion 150a of the heatpipe 150.

The heat transferred to the heating portion 150a of the heatpipe 150 heats and evaporates a coolant filled within the heatpipe 150. The evaporated coolant is rapidly moved by a pressure difference to the condensing portion 150b whose pressure is relatively lower than the heating portion 150a, so that the heat transfer by convection can be rapidly achieved. Some of the heat transferred to the condensing portion 150b is dissipated into the atmosphere in the neighborhood of the condensing portion 150b by convection, and a remaining portion of the heat is transferred either directly to the chassis 130 directly contacting with the condensing portion 150b or indirectly to the chassis 130 via a separate member interposed therebetween. This heat transferred to the chassis 130 is then dissipated.

Therefore, since the heat generated by the IC chip 133 is effectively dissipated to the heatpipe 150 and to the chassis 130, the heat does not remain concentrated at the IC chip 133 and thus a temperature thereof is kept low. With such a heat dissipation structure, not only is the performance of the IC chip 133 preserved but also the lifespan of the IC chip 133 is extended, so that the lifespan of the display module 100 can be remarkably extended.

Since a predetermined heatsink effect is achieved by merely installing the heatpipe 150, a heatsink plate (not illustrated) or a heatsink fan (not illustrated) are no longer necessary to keep the temperature of the IC chip 133 from rising to excessive levels. Further, the above construction for a heatpipe 150 is easy to manufacture, keeping the cost for the display module 100 down.

Figure 4:
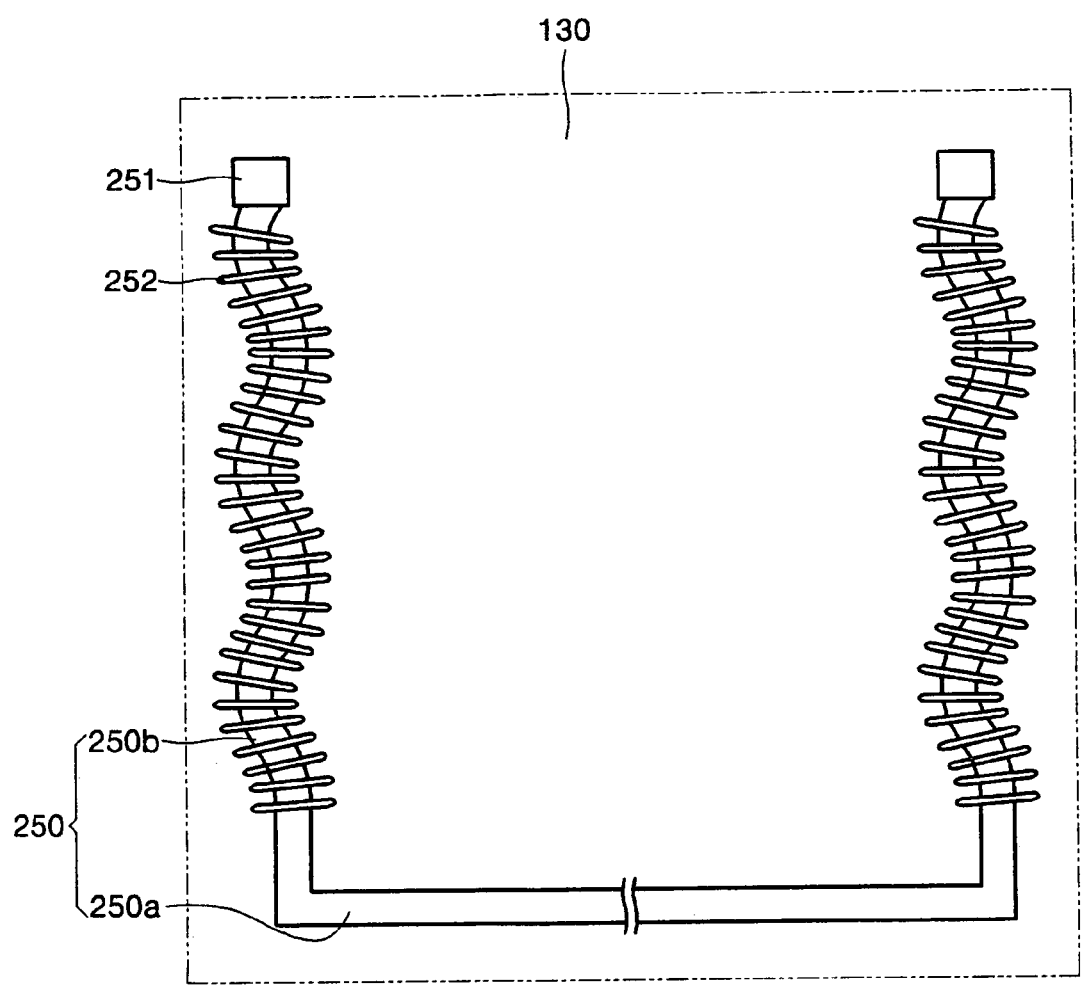
FIG. 4 is a plan view of a chassis of a display module according to a second embodiment of the present invention.

Turning now to FIG. 4, FIG. 4 is a plan view of a chassis of a display module according to a second embodiment of the present invention. In FIG. 4, like reference numerals denote like elements and therefore a repeat discussion thereof will not be repeated here. The second embodiment of the present invention is similar to the first embodiment except that at least part of the heatpipe 250 is formed to have serpentine shape. Here, the forming of the heatpipe 250 having a serpentine shape means forming the heatpipe 250 in a curved, zigzag shape. By having the serpentine shaped heatpipe 250, the contact area between the heatpipe 250 and the chassis 130 and the convex member 160 are maximized and thus a heat transfer area of the heatpipe 250 is remarkably increased.

Moreover, at least a condensing portion 250b among portions of the heatpipe 250 can be formed in the serpentine shape. That is, in the second embodiment, a heating portion 250a of the heatpipe 250 has a shape and an arrangement similar (i.e., a straight section as opposed to being serpentine) to that of the first embodiment. The reason for this is so the heating portion 250a can establish contact with as much of the one surface of the convex member 160 supporting the IC chip 133 as possible as the space through which the heating portion 250a contacts the convex member 160 is very narrow and limited. Therefore, the heating portion 250a does not need to have a serpentine shape. Only the condensing portion 250b of the heatpipe 250 needs to be of a serpentine shape. As in the first embodiment, an end-cap 251 and a heatsink pin 252 can be further provided.

The present invention is not limited to a heatpipe in a plasma display module with the PDP, but can be applied to any display module having a display device that has a component emitting a large amount of heat.

According to the present invention, it is possible to provide a display module that uses a heatpipe capable of rapidly transferring heat from a heat producing IC chip to a chassis for dissipation to ambient air, resulting in an improved heatsink effect at the IC chip. Also, the present invention provides a display module that uses a simple and inexpensive heatpipe capable of improving a heatsink effect without the need for a heatsink plate and/or a heatsink fan, resulting is reduced manufacturing costs.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A display module, comprising:
a display panel to display an image;
a chassis to support the display panel;
a driver circuit unit arranged on the chassis to generate an electrical signal that drives the display panel;
a signal transmitting unit electrically connecting the driver circuit unit to the display panel;
an integrated circuit chip (IC chip) arranged on the signal transmitting unit, the integrated circuit to control signal transmission between the driver circuit unit and the display panel;
at least one heatpipe arranged on a side of the chassis opposite the display panel, the heatpipe to transfer heat generated by the IC chip to the chassis; and
a convex unit arranged on the chassis to reinforce a rigidity of the chassis, the signal transmitting unit being arranged on a surface of the convex unit facing away from the chassis, at least one portion of the at least one heatpipe being arranged between the chassis and a portion of the convex unit; the IC chip arranged on the a surface of the signal transmitting unit that corresponds with the convex unit.

2. The display module of claim 1, wherein the heatpipe is filled with a coolant.

3. The display module of claim 1, wherein the heat pipe comprises one heating portion and one condensing portion, wherein sidewalls of the one heating portion are in contact with a convex unit to transfer heat from the IC chip to the heatpipe, wherein sidewalls of the condensing portion of the heatpipe are in contact with the chassis.

4. The display module of claim 2, wherein the coolant comprises Freon gas.

5. The display module of claim 1, wherein the heatpipe comprises the heating portion and a condensing portion, the heating portion being distinguished from the condensing portion.

6. The display module of claim 5, further comprising at least one heatsink pin arranged at the condensing portion of the heatpipe.

7. The display module of claim 1, wherein the heatpipe is of a U-shape, the heatpipe having a flat bottom.

8. The display module of claim 7, wherein the heating portion has a straight-line shape, wherein both ends of the straight-line-shaped heating portion of the heatpipe are respectively connected to bottoms of straight-line-shaped condensing portions, the heating portion being essentially perpendicular to the condensing portions.

9. The display module of claim 1, wherein an area of a surface of the heating portion contacting the convex unit is substantially identical to an area of the surface of the convex unit facing the heating portion.

10. The display module of claim 5, wherein one surface of the condensing portion either directly contacts a surface of the chassis facing the condensing portion or contacts the surface of the chassis through a separate member arranged therebetween.

11. The display module of claim 1, wherein the heatpipe comprises an end-cap to seal the heatpipe.

12. The display module of claim 11, wherein the end-cap is arranged at both ends of the heatpipe.

13. The display module of claim 1, wherein the heatpipe has a quadrangular duct-shaped cross-section.

14. The display module of claim 1, wherein the heatpipe has an arch-shaped cross-section.

15. The display module of claim 5, wherein one surface of the heating portion of the heatpipe is arranged to either directly contact the convex unit or contact the convex unit through a separate member arranged therebetween, and wherein an inner thickness of the heating portion of the heatpipe being substantially identical to an inner width of the convex unit.

16. The display module of claim 1, the heatpipe being a thermosyphon.

17. The display module of claim 5, the heating portion of the heatpipe extending along a bottom edge of the display, and the condensing portion extends along a side edge of the display.

18. The display module of claim 7, the U-shaped heatpipe comprises two side portions and a middle portion, the middle portion being a heating portion and extending along a bottom edge of the chassis, the two side portions being condensing portions and extending along opposite side edges of the display.

19. A display module, comprising:

a display panel displaying an image;

a chassis arranged on the display panel and supporting the display panel;

a convex unit arranged on the chassis to reinforce a rigidity of the chassis;

a driver circuit unit arranged on the chassis and generating an electrical signal that drives the display panel;

a signal transmitting unit arranged on the convex unit and electrically connecting the driver circuit unit to the display panel;

an integrated circuit chip (IC chip) arranged on the signal transmitting unit, the integrated circuit controlling, signal transmission between the driver circuit unit and the display panel;

a heatpipe dissipating heat generated by the IC chip, the heatpipe including a heating portion and at least one condensing portion, the heating portion extending horizontally along a bottom edge of the chassis in a space between the chassis and a portion of the convex unit, the at least one condensing portion extending vertically along one side edge of the chassis.

20. The display module of claim 19, the heatpipe being a thermosyphon, the heatpipe being filled with a working fluid, the heatpipe uses gravity and convection to draw heat away from the IC chip.

21. The display module of claim 19, the IC chip being arranged on a side of the convex unit that faces away from the display panel, the heating portion of the heatpipe being arranged on a side of the convex unit facing the display panel.

* * * * *